United States Patent
Seo (10) Patent No.: US 7,689,883 B2
(45) Date of Patent: Mar. 30, 2010

(54) TEST CONTROL CIRCUIT AND SEMICONDUCTOR MEMORY DEVICE INCLUDING THE SAME

(75) Inventor: Woo Hyun Seo, Seoul (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 273 days.

(21) Appl. No.: 11/777,523

(22) Filed: Jul. 13, 2007

(65) Prior Publication Data
US 2008/0163018 A1    Jul. 3, 2008

(30) Foreign Application Priority Data
Dec. 28, 2006   (KR) ...................... 10-2006-0137176

(51) Int. Cl.
*G11C 29/00* (2006.01)
(52) U.S. Cl. ...................... 714/724; 714/718
(58) Field of Classification Search ................ 714/724, 714/718; 365/201
See application file for complete search history.

(56) References Cited
U.S. PATENT DOCUMENTS

2003/0093730 A1* 5/2003 Halder et al. ............... 714/724
2004/0268193 A1* 12/2004 Nishida et al. .............. 714/724

* cited by examiner

Primary Examiner—Vu A Le
(74) Attorney, Agent, or Firm—Ladas & Parry LLP (57) ABSTRACT

The present invention relates to a test control circuit controlling a test of an internal circuit and a semiconductor memory device including the same. The present invention provides a test control circuit having: an encoding unit encoding test mode signals input from the external and transferring them to global lines; a decoding unit decoding the signals transferred from the global lines; and a test mode enable signal generating circuit generating test mode enable signals controlling a test mode enable by combining the output signals of the decoding unit and an address designating a test mode item code.

20 Claims, 7 Drawing Sheets

TEST CONTROL CIRCUIT AND SEMICONDUCTOR MEMORY DEVICE INCLUDING THE SAME

CROSS-REFERENCE TO RELATED APPLICATIONS

The present application claims priority to Korean patent application number 10-2006-137176 filed on Dec. 28, 2006, which is incorporated herein by reference in its entirety.

BACKGROUND OF THE INVENTION

The present invention relates to a semiconductor memory device, and more particularly to a test mode control circuit controlling the test of an internal circuit.

In general, in the development and production of semiconductor memory device products, a test mode is used for detecting the characteristics and functions of the products required for the specification thereof, and confirming whether the functions required in mounting the components thereof are normally performed in a correct manner.

Figure 1:
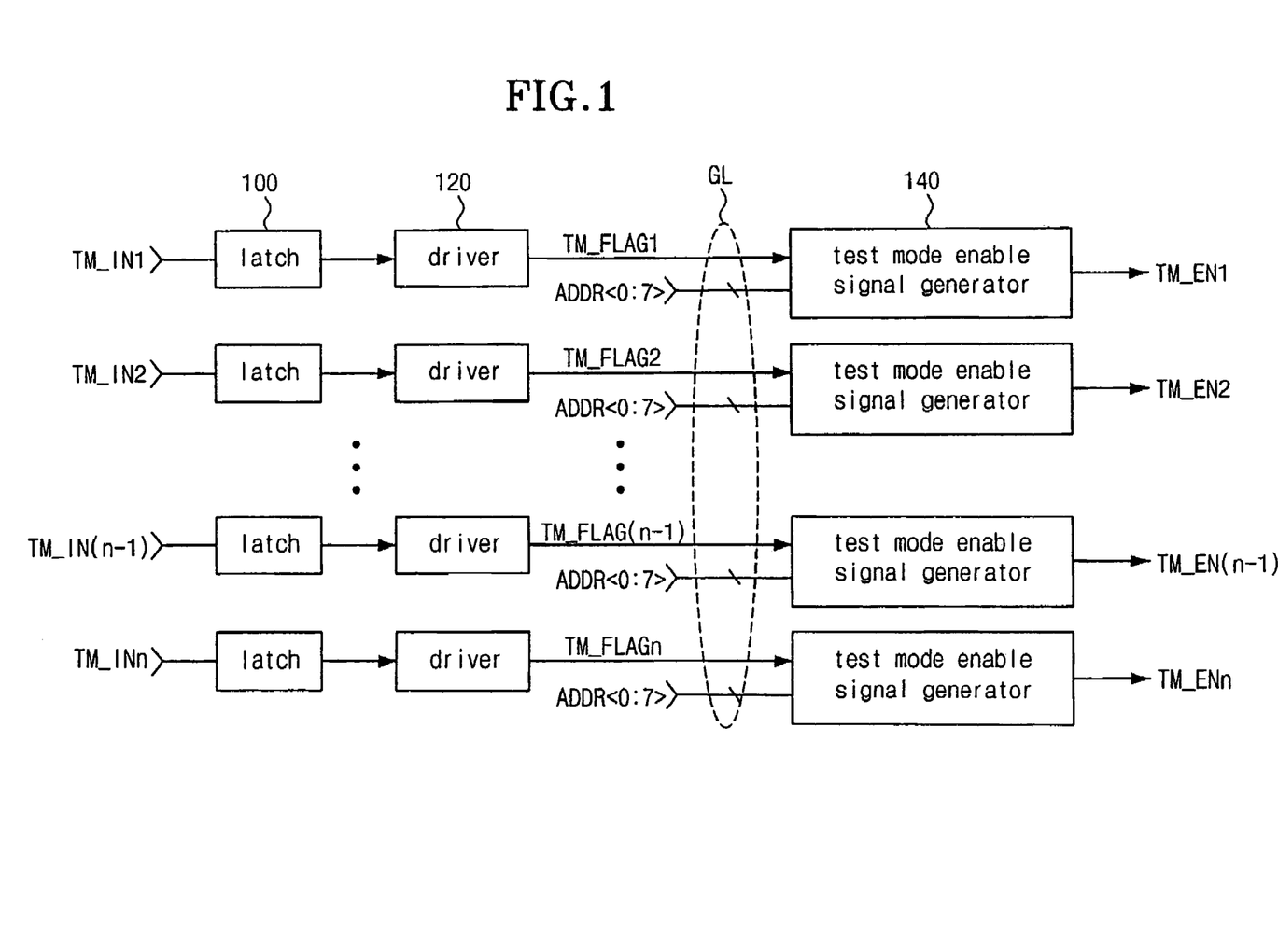
FIG. 1 depicts a block view showing a conventional test control circuit.

Referring to FIG. 1, a conventional test control circuit controlling the test mode receives test mode signals TM_IN1-TM_INn corresponding to the number of test mode items, latches the input test mode signals TM_IN1-TM_INn in response to a plurality of latches 100, amplifies the latched signals in response to a plurality of drivers 120, respectively, and outputs the amplified signals in the plurality of drivers 120 to the plurality of test mode flag signals TM_FLAG1~TM_FLAGn.

And, the plurality of test mode flag signals TM_FLAG1~TM_FLAGn are input to a plurality of test mode enable signal generators 140, respectively, through the global lines GL. The input plurality of test mode flag signals TM_FLAG1~TM_FLAGn are combined with addresses ADDR <0:7> designating a test mode item code in the plurality of test mode enable signal generators 140 to be output to a plurality of test mode enable signals TM_EN1~TM_ENn.

As described above, the conventional test control circuit combines the test mode signals TM_IN1~TM_1Nn with the addresses ADDR<0:7>, respectively, to generate a plurality of test mode enable signals TM_EN1~TM_ENn controlling various kind of enables. To this end, the conventional test control circuit comprises latches, drivers, and global lines GL, as many as, the test mode items.

Therefore, the conventional semiconductor memory devices suffer a problem that many areas are required for arranging circuits and lines relating to test modes.

SUMMARY OF THE INVENTION

The present invention can realize a reduced area by reducing the number of the circuits and lines required in transferring test mode signals to internal circuits.

The present invention provides a test control circuit comprising: an encoding unit encoding test mode signals input from an external source and transferring the encoded test mode signals to global lines; a decoding unit decoding the encoded signals transferred from the global line; and a test mode enable signal generating circuit generating test mode enable signals controlling a test mode enable by combining output signals from the decoding unit and an address designating a test mode item code.

In one preferred embodiment, the encoding unit encodes the test mode signals by dividing the test mode signals into groups, and the grouped and encoded test mode signals control the test of internal circuits arranged in the region divided in a semiconductor memory device. Herein, preferably, the region divided in the semiconductor memory device has a core region and a peripheral circuit region.

The encoding unit comprises: an encoder encoding each of the test mode signals with control signals for encoding; a plurality of latches latching the output signals of the encoder, respectively; and a plurality of drivers amplifying the output signals of the plurality of latches, respectively.

Preferably, the test mode enable signal generating circuit generates the test mode enable signals corresponding to a test mode item code by analyzing the address.

The present invention provides a test control circuit comprising: a coding unit outputting test mode signals input from the external in response to control signals; and a test mode enable signal generating circuit generating test mode enable signals controlling a test mode enable by combining the output signals of the coding unit with an address designating a test mode item code.

Preferably, the coding unit comprises: an encoding unit encoding the test mode signals in response to the control signals and transferring the encoded test mode signals to a global line; and a decoding unit decoding the signals transferred from the global lines in response to the control signal.

Preferably, the encoding unit encodes the test mode signals by dividing the test mode signals into groups, and the grouped and encoded test mode signals control the test of internal circuits arranged in the region divided in a semiconductor memory device. Herein, preferably, the region divided in the semiconductor memory device is a core region and a peripheral circuit region.

The coding unit, preferably, the encoding unit comprises: an encoder encoding each of the test mode signals with the control signal; a plurality of latches latching the output signals of the encoder, respectively; and a plurality of drivers amplifying the output signals of the plurality of latches, respectively.

Preferably, the test mode enable signal generating circuit generates the test mode enable signals corresponding to a test mode item code by analyzing the address.

The present invention provides a semiconductor memory device comprising: an encoding unit arranged in a peripheral circuit region, and encoding test mode signals input from the external, respectively, and transferring the encoded test mode signals to a global line; a first decoder arranged in the peripheral circuit region, and decoding some of the encoding signals transferred from the global line; a first test mode enable generator arranged in the peripheral circuit region, and generating first test mode enable signals by combining the output signals of the first decoder with an address designating a test mode item code; a peripheral circuit arranged in the peripheral circuit region, and controlling a test using the first test mode enable signals; a second decoder arranged in a core region, and receiving some of the encoding signals transferred from the global lines through a local line and decoding them; a second test mode enable generator arranged in the core region, and generating second test mode enale signals by combining the output signals of the second decoder with the address; and a core circuit arranged in the core region, and controlling a test with the second test mode enable signals.

Preferably, the peripheral circuit comprises a power supply circuit and a delay locked loop circuit, and the core circuit comprises a sensing amplifier and an address decoder.

Preferably, the encoding unit encodes test mode signals controlling tests of the same peripheral circuit and peripheral circuits adjacently arranged among the test mode signals, respectively, and encodes test mode signals controlling tests of the same core circuit and core circuits adjacently arranged among the test mode signals, respectively.

Preferably, the first decoder and the first test mode enable signal generator are adjacently arranged to the peripheral circuit and the second decoder and the second test mode enable signal generator are adjacently arranged to the core circuit.

DESCRIPTION OF SPECIFIC EMBODIMENTS

Hereinafter, preferred embodiments of the present invention will be described in detail with reference to the accompanying drawings.

In the present invention, the same or like features such as the applications of test mode signals to the same internal circuits or to the internal circuits adjacently arranged each other are grouped The grouped test mode signals are encoded in each group unit to be transferred to global lines. The encoded signals transferred by the global lines are decoded and the decoded signals are combined with addresses to be transferred to the corresponding internal circuit as the test mode enable signals.

Figure 2:
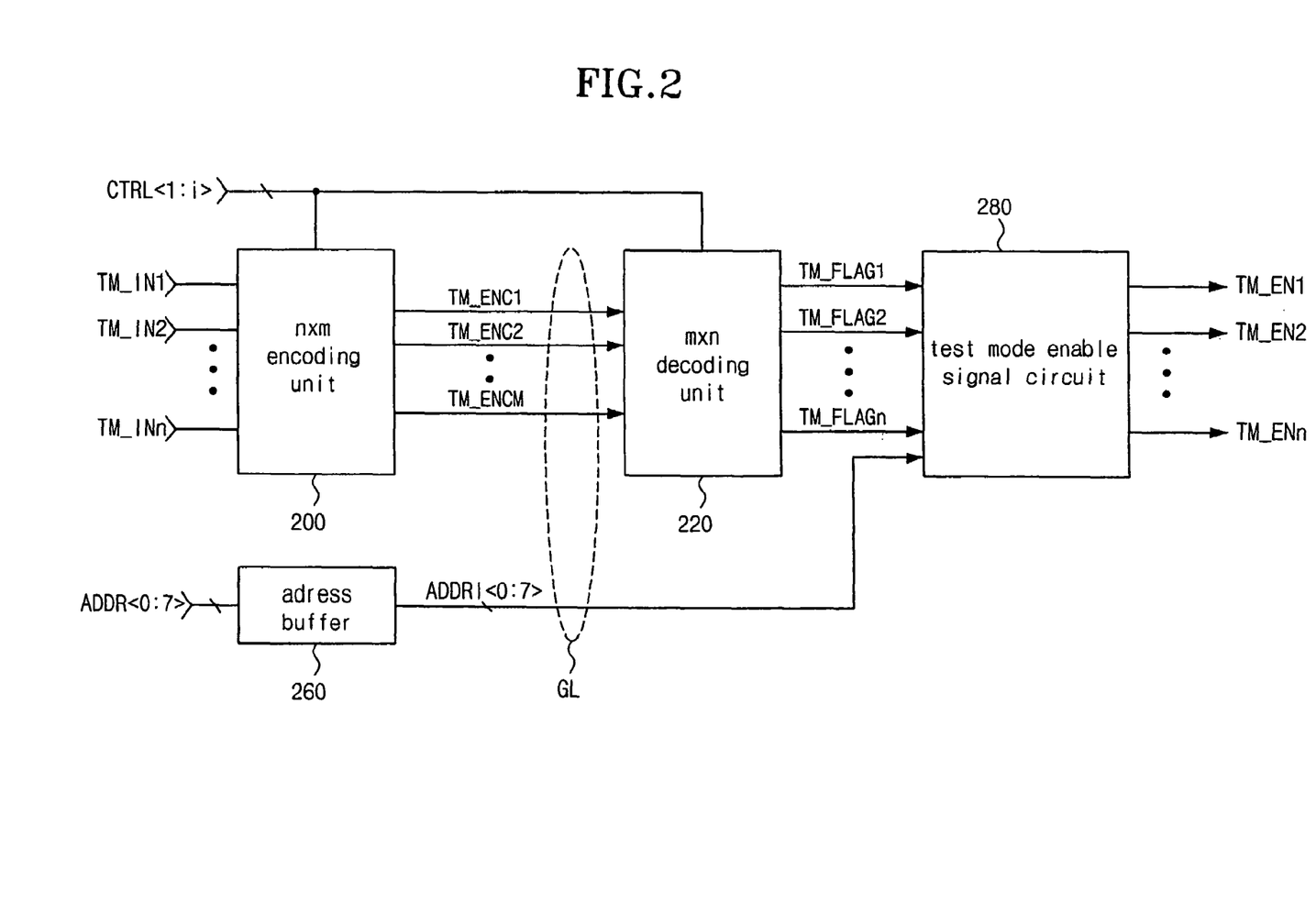
FIG. 2 depicts a block view showing a test control circuit according to the present invention.

Specifically, a test control circuit of the present invention can be practiced as in FIG. 2, wherein the test control circuit of FIG. 2 comprises an n×m encoding unit 200, m×n decoding unit 220, an address buffer 260, and a test mode enable signal generating circuit 280.

The n×m encoding unit 200 encodes n test mode signals TM_IN1~TM_Inn with i control signals CTRL <1:i> to be output as m test mode encoding signals TN_ENC1~TN_ENCm. Herein, each test mode encoding signal TM_ENC1~TN_ENCm is a signal encoding the n test mode signals TM_IN1~TM_INn with the group unit of the m signals. Also, n is a natural number of 2 or more and m and i are natural numbers smaller than n.

Figure 3:
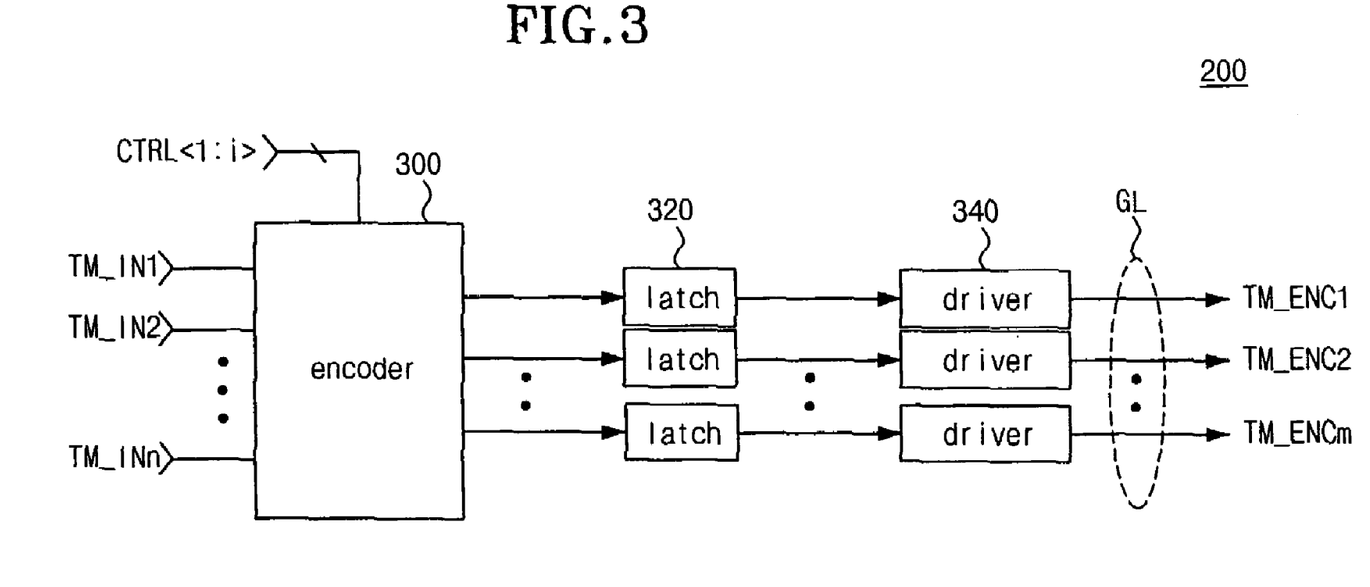
FIG. 3 depicts a block view showing the detailed constitution of an n×m encoding unit 200 of FIG. 2.

The n×m encoding unit 2C0 can be practiced as in FIG. 3, and can be constituted by an encoder 300 encoding n test mode signals TM_IN1~TM_INn with i control signals CTRL <1:i>, a plurality of latches 320 each latching the output signals of the encoder 300, and a plurality of drivers 340 each amplifying the output signals of the plurality of latches 300 to be output as the test mode encoding signals TM_ENC1~TN_ENCm.

Figure 4:
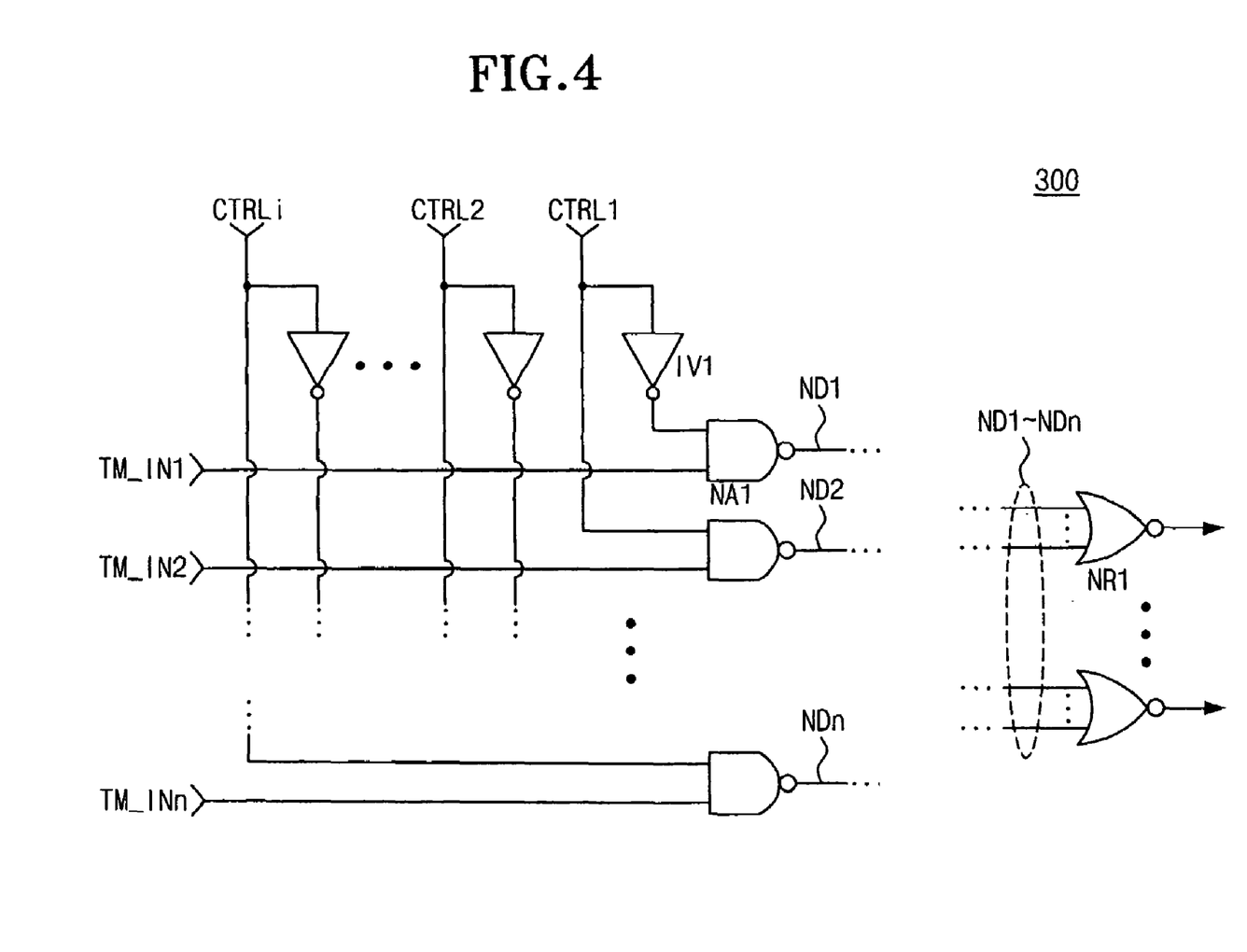
FIG. 4 depicts a circuit view showing one example of an encoder 300 of FIG. 3.

The encoder, which encodes the n test mode signals TM_IN1~TM_INn with the I control signals CTRL<1:i>, can be constituted as in FIG. 4 as one example.

The encoder 300 of FIG. 4 can be constituted by ½ inverters IV1 each inverting the control signals CTRL<1:i>, n NAND gates (NA1) each NAND-combining together the control signals CTRL<1:i> or the output signals of the plurality of inverters (IV1) and the test mode signals TM_IN1~TM_INn and m NOR gates NR1 each NOR-combining together the output signals the n NAND gates NA1.

Herein, it is preferable that the number of the control signals CTRL <1:i> is a half of the number of the test mode signals TM_IN1~TM_INn. And, it is preferable that the output nodes ND1~NDn of the plurality of NAND gates NA1 are divided into m groups to be connected to each NOR gates NR1.

The encoder 300 having the constitution as in FIG. 4 NAND-combines together the output signals of the respective inverters IV1 and odd numbered test mode signals, that is, TM_IN1, TM_IN3, etc., and NAND-combines the respective control signals CTRL <1:i> and even numbered test mode signals, that is, TM_IN2, TM_IN4, etc. The encoder 300 divides the NAND-combined n signals into m groups and NOR-combines together the m grouped signals, respectively, to output the m encoding signals.

Each of the m encoding signals is output as the test mode encoding signals TM_ENC1~TN_ENCm via the latch 320 and the driver 340. The test mode encoding signals TM_ENC1~TN_ENCm output from the n×m encoding unit 200 are transferred to the m×n decoding unit 220 via the plurality of global lines GL. Herein, it is preferable that the number of the global lines is set to m corresponding to the number of the output signals of the encoder 300.

The m×n decoding unit 220 decodes the m test mode encoding signals TM_ENC1~TN_ENCm with the I control signals CTRL <1:i> to be output as n test mode flag signals TM_FLAG1~TM_FLAGn.

Figure 5:
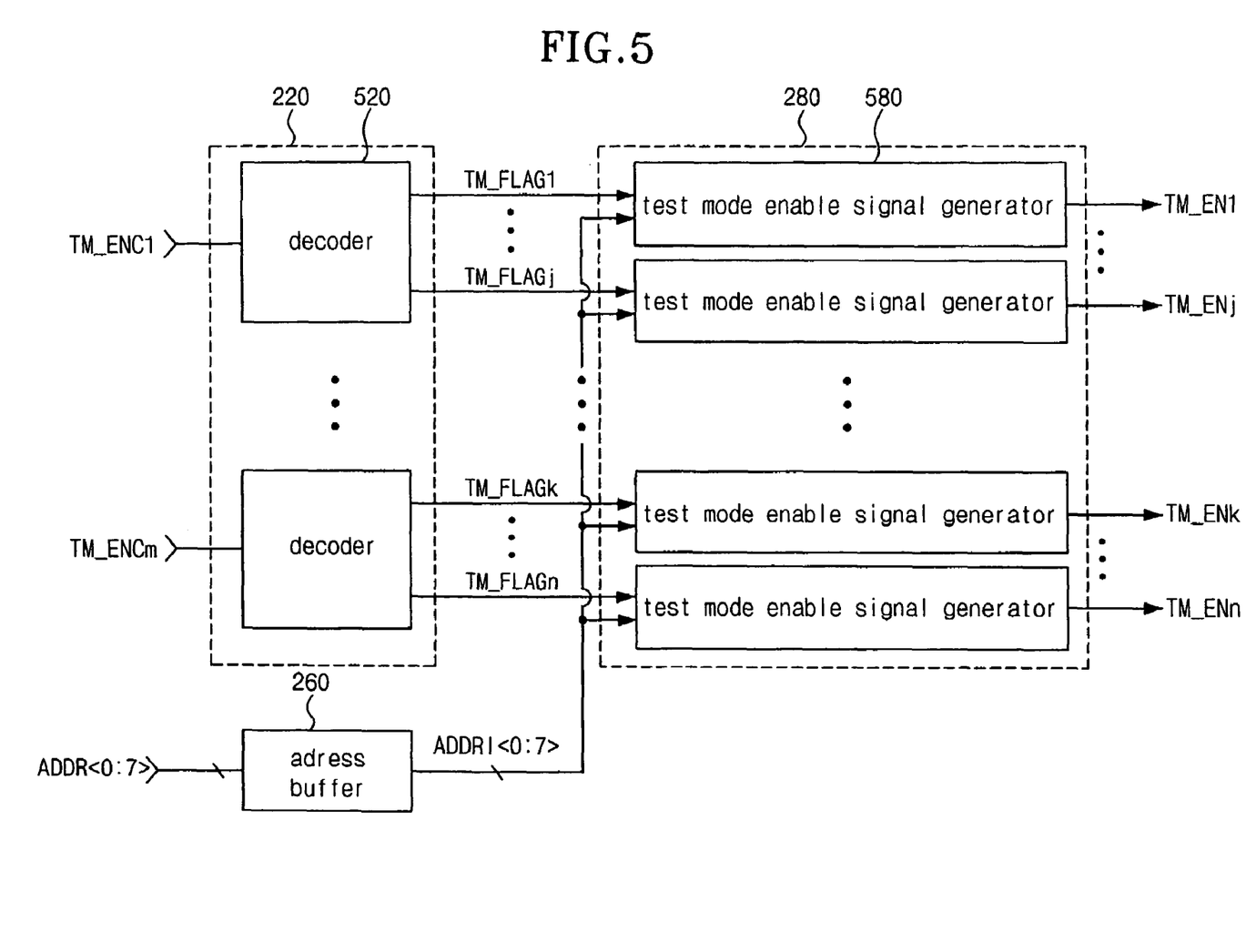
FIG. 5 depicts a block view showing the detailed constitution of an n×m decoding unit 220 and a test mode enable signal generating circuit 280 of FIG. 2.

The m×n decoding unit 220 can be constituted by a plurality of decoders 520 adjacently arranged to each internal circuit to which the test mode encoding signals TM_ENC1~TN_ENCm are transferred, as shown in FIG. 5.

For example, the decoder 520 receiving a test mode encoding signal TM_ENC1 decodes the test mode encoding signal TM_ENC1 to be output as j test mode flag signals TM_FLAG1~TM_FLAGj and the decoder 520 receiving a test mode encoding signal TM_ENCm decodes the test mode encoding signal TM_ENCm to be output as n-k test mode flag signals TM_FLAGk~TM_FLAGn. Herein, k is a natural number smaller than n and j is a natural number smaller than k.

The address buffer 260 buffers test related external address ADDR <0:7> to be output as internal addresses ADDRI <O:7>.

And, the test mode enable signal generating circuit 280 combines the test mode flag signals TM_FLAG1~TM_FLAGn with the internal addresses ADDRI<0:7> to be output as the test mode enable signals TM_EN1~TM_ENn.

The test mode enable signal generating circuit 280 can be constituted by a plurality of test mode enable signal generators 580 each combining the respective test mode flag signals TM_FLAG1~TM_FLAGn and the respective internal addresses ADDRI<0:7>, as shown in FIG. 5.

And, the respective test mode enable signal generator 580 has a constitution decoding the internal addresses ADDRI<0:7> in response to the test mode item and combining the decoded addresses and the respective test mode flag signals TM_FLAG1~TM_FLAGn.

In the test mode enable signal generator 580 combining the test mode flag signal TM_FLAG 1 and the internal addresses ADDRI<0:7>, the constitution of the case where the test mode item code is '81' will be described with reference to FIG. 6.

Figure 6:
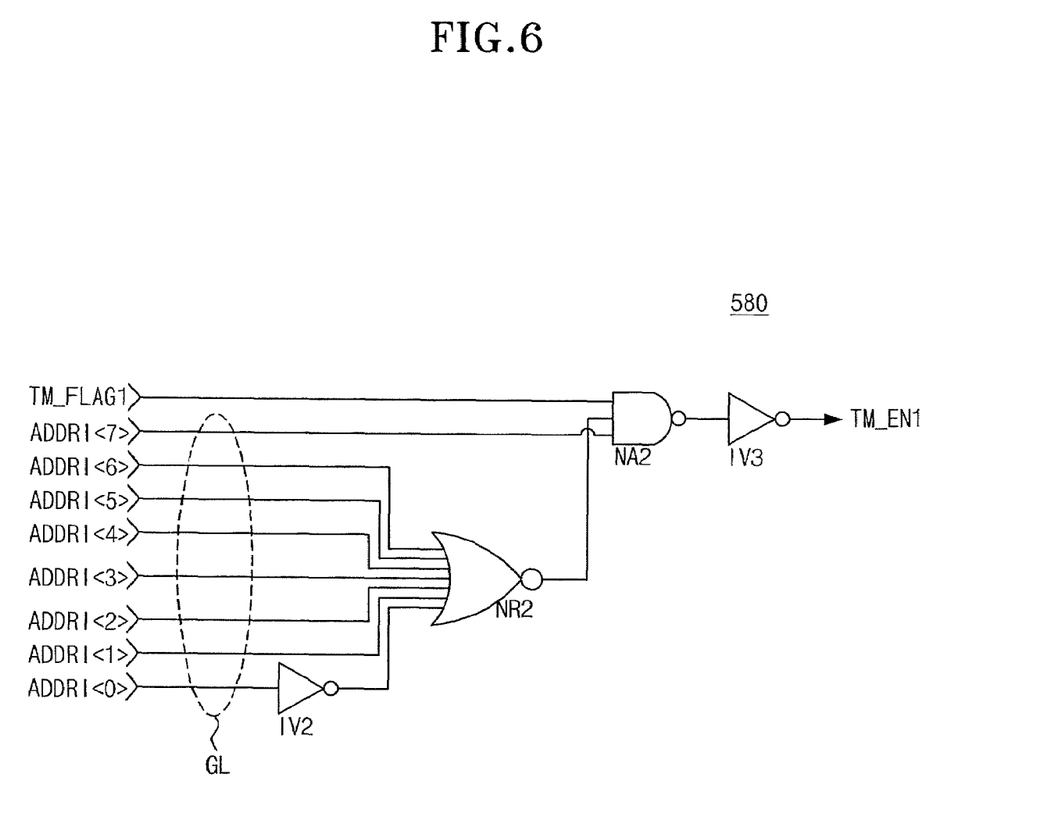
FIG. 6 depicts a circuit view showing one example of the constitution of a test mode enable signal generator 580 combining a test mode flag signal TM_FLAG1 and an internal addresses ADDRI<0:7>.

The test mode enable signal generator 580 of FIG. 6 can be composed of an inverter IV2 inverting the internal address ADDRI<0>; a NOR gate NR2 NOR-combining together the internal addresses ADDRI<1:6> and the output signals of the inverter; a NAND gate NA2 NAND-combining together the test mode flag signal TM_FLG1, the internal address ADDRI<7>, and the output signal of the NOR gate NR2; and an inverter IV3 inverting the output signal of the NAND gate NA2 to be output as the test mode enable signal TM_EN1.

Herein, since the internal address ADDRI<7> is an address that informs the test mode, it always has a high level when entering the test mode. And, since the test mode item code is '81', the internal address ADDRI<0> is set at the high level and all the remaining internal addresses ADDRI<0:6> other than the internal address ADDRI<7> associated with the entry of the test mode have a low level.

That is, if the test mode item code enters the test mode of '81', the test mode flag signal TM_FLAG1, the internal address ADDRI<7>, and the output signal of the NOR gate NR2 are set at a high level together so that the test mode enable signal TM_EN1 is then enabled.

The operation and arrangement relation of the test control circuit of the present invention having such a constitution will be described in more detail.

Figure 7:
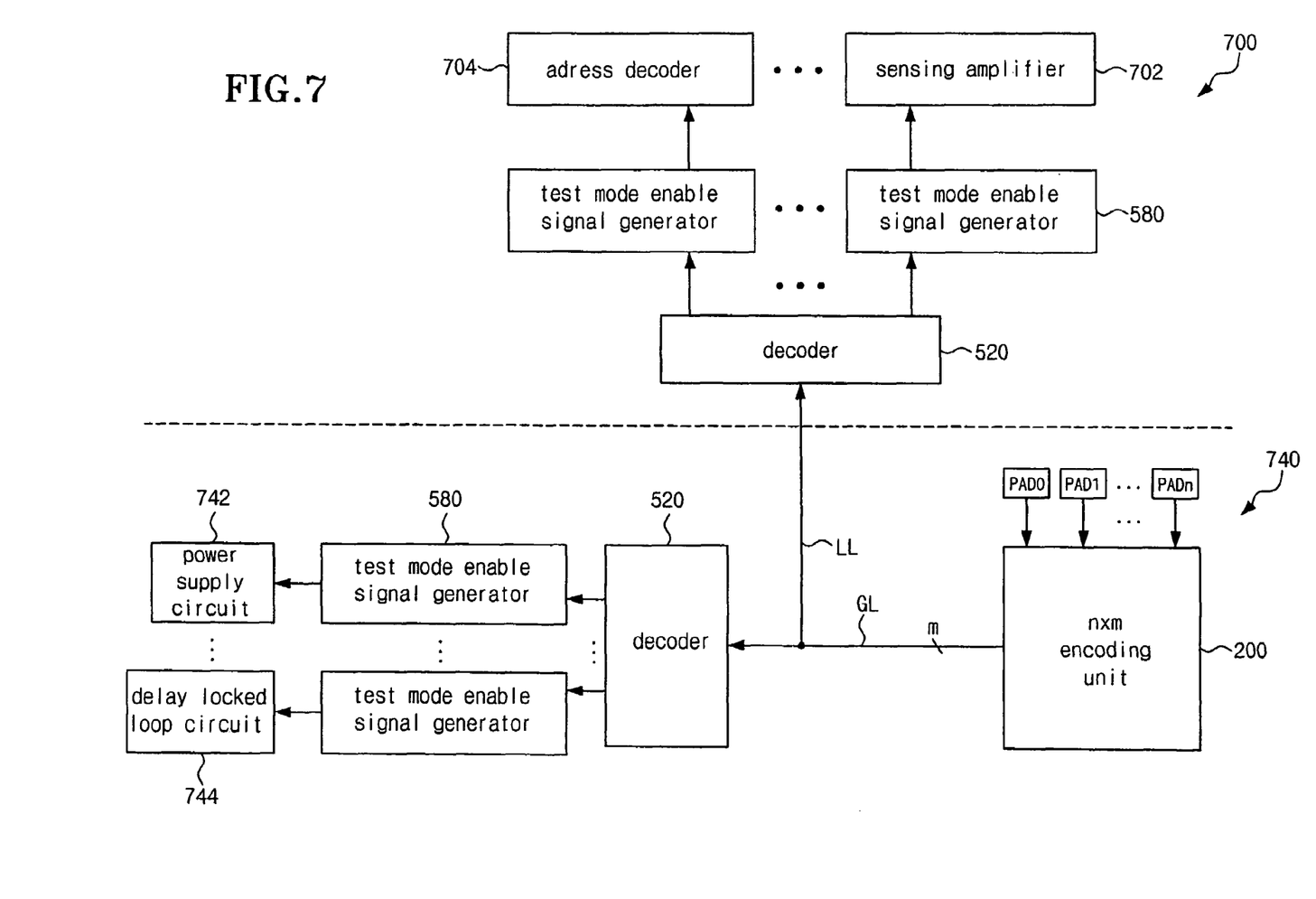
FIG. 7 depicts an arrangement view showing the arrangement of a test control circuit of the present invention in a semiconductor memory device.

First, if the test mode signals TM_IN1~TM_INn each is input from n pads PAD0~PADn, the test mode signals TM_IN1~TM_INn are encoded with the m test mode encoding signals TM_ENC1~TN_ENCm and transferred to the global lines GL through the n×m encoding unit 200. Herein, it is preferable that the n×m encoding unit 200 is disposed in a peripheral circuit region 740 which is provided with a power supply circuit 742 and a delay locked loop circuit 744, etc., in the semiconductor memory device.

The test mode encoding signals TM_ENC1~TN_ENCm are then transferred to a core region 700 which is provided with a sensing amplifier 702 and an address decoder 704, etc., via the global lines GL and local lines and also transferred to the peripheral circuit region 740 via the global lines GL.

The test mode encoding signals transferred to the core region 700 are decoded through the decoders 520 and then output as the test mode enable signals, for example, TM_EN1~TM_ENj through the test mode enable signal generator 580. And, the test mode enable signals TM_EN1~TM_ENj are input to the sensing amplifier 702 and the address decoder 704 in the core region 700, etc., and used to control the corresponding test operation.

The test mode encoding signals transferred to the peripheral circuit region 740 are decoded through the decoders 520 and then output as the test mode enable signals, for example, TM_ENk~TM_ENn through the test mode enable signal generator 580. Then, the test mode enable signals TM_ENk~TM_ENn are input to the power supply circuit 742 and the delay locked loop 744 in the peripheral circuit region 740 and used to control the corresponding test operation.

As described above, the test control circuit of the present invention encodes the n test mode signal TM_IN1~TM_INn with the m test mode encoding signals TM_ENC1~TN_ENCm and then transfers the m test mode encoding signals TM_ENC1~TN_ENCm to the decoders 20 of the m×n decoding unit 220 adjacently arranged to the internal circuits to be tested through the global lines GL. The m test mode encoding signals TM_ENC1~TN_ENCm are decoded with the n test mode flag signals TM_FLAG1~TM_FLAGn through the decoders 520.

Accordingly, since the number of the global lines GL transferring the test mode related signals to each of the internal circuits reduces to m, it is capable of deriving benefit in an area.

Also, when the n test mode signals TM_IN1~TM_INn input from the external are transferred to the corresponding internal circuits, each test mode signals TM_IN1~TM_INn has to pass through the latch and the driver in order to adjust the timing and level.

Since the test control circuit of the present invention encodes the n test mode signals TM_IN1~TM_INn with the m test mode encoding signals TM_ENC1~TN_ENCm to transfer them to the internal circuits, only the latch and the driver corresponding to the number of the encoded signals are needed.

The size of the driver used for amplifying the test mode signals is determined according to the positions of the test control circuit and the internal circuit to be tested. Therefore, the internal circuits adjacently arranged can share the driver having the same size.

The test control circuit of the present invention encodes the n test mode signals TM_IN1~TM_INn with the m test mode encoding signals TM_ENC1~TN_ENCm to transfer them to the latch and the driver so that they are transferred to the same internal circuits and the internal circuits adjacently arranged each other, respectively, making it possible to reduce the number of the latch and the driver as compared to the related art However, although the encoder 300 and the plurality of decoders 520 are added in order to perform the coding, they occupy less area as compared to the latch and the driver corresponding to the number of the existing test mode items so that the area occupied by the test control circuit in the semiconductor memory device can be reduced.

As such, the present invention encodes the plurality of test mode signals input from the external and transfers them to the global lines so that the number of the global lines can be reduced, making it possible to reduce the area occupied by the lines.

Also, the present invention encodes the plurality of test mode signals input from the external and then latches and amplifies the encoded signals to transfer them to the internal circuits so that the number of the latches and the drivers is reduced, making it possible to reduce the area occupied by the test control circuit in the semiconductor memory device.

What is claimed is:

1. A test control circuit comprising:
    an encoding unit encoding test mode signals input from an external source and transferring the encoded test mode signals to global lines;
    a decoding unit decoding the signals transferred from the encoding unit through the global lines; and
    a test mode enable signal generating circuit generating test mode enable signals controlling a test mode enable wherein the test mode enable responding to the output signals from the decoding unit and responding to internal addresses.

2. The test control circuit as set forth in claim 1, wherein the encoding unit encodes the test mode signals by dividing the test mode signals into groups, and the grouped and encoded test mode signals control a test of the internal circuits arranged in a region divided in a semiconductor memory device.

3. The test control circuit as set forth in claim 2, wherein the region divided in the semiconductor memory device is a core region and a peripheral circuit region.

4. The test control circuit as set forth in claim 1, wherein the encoding unit comprises:
   an encoder encoding each of the test mode signals using control signals;
   a plurality of latches latching the output signals of the encoder, respectively; and
   a plurality of drivers amplifying the output signals of the plurality of latches, respectively.

5. The test control circuit as set forth in claim 1, wherein the test mode enable signal generating circuit generates the test mode enable signals corresponding to a test mode item code in response to the internal address.

6. A test control circuit comprising:
   an address buffer buffering external addresses and providing external addresses to internal addresses;
   a coding unit outputting test mode signals input from the external source in response to control signals; and
   a test mode enable signal generating circuit generating test mode enable signals controlling a test mode enable by combining the output signals from the coding unit with an address designating a test mode item code.

7. The test control circuit as set forth in claim 6, wherein the coding unit comprises:
   an encoding unit encoding the test mode signals in response to the control signals and transferring the encoded test mode signals to global lines; and
   a decoding unit decoding the signals transferred from the global lines in response to the control signals.

8. The test control circuit as set forth in claim 7, wherein the encoding unit encodes the test mode signals by dividing the encoded test mode signals into groups, and the grouped and encoded test mode signals control a test of internal circuits arranged in the region divided in a semiconductor memory device.

9. The test control circuit as set forth in claim 8, wherein the region divided in the semiconductor memory device is a core region and a peripheral circuit region.

10. The test control circuit as set forth in claim 7, wherein the encoding unit comprises:
    an encoder encoding each of the test mode signals with the control signals;
    a plurality of latches latching the output signals of the encoder, respectively; and
    a plurality of drivers amplifying the output signals of the plurality of latches, respectively.

11. The test control circuit as set forth in claim 6, wherein the test mode enable signal generating circuit generates the test mode enable signals corresponding to a test mode item code in response to the address designating the test mode test code.

12. The test control circuit as set forth in claim 1, further comprising an address buffer buffering external addresses and providing the external addresses to the internal addresses.

13. A semiconductor memory device comprising:
    an encoding unit arranged in a peripheral circuit region, and encoding test mode signals input from an external source, respectively, and transferring the encoded test mode signals to global lines;
    a decoder arranged in the peripheral circuit region, and decoding some of the encoded test mode signals transferred from the global lines;
    a test mode enable generator arranged in the peripheral circuit region, and generating test mode enable signals in response to output signals from the decoder and in response to internal addresses; and
    a peripheral circuit arranged in the peripheral circuit region, and controlling a test with the test mode enable signals.

14. The semiconductor memory device as set forth in claim 13, wherein the peripheral circuit comprises at least one power supply circuit and at least one delay locked loop circuit.

15. The semiconductor memory device as set forth in claim 13, wherein the encoding unit groups test mode signals into signal groups defined as same or about the same peripheral circuits, and the encoding unit performs the encoding in the signal group unit.

16. The semiconductor memory device as set forth in claim 13, further comprising an address buffer buffering external addresses the buffered external address and providing as the internal addresses.

17. A semiconductor memory device comprising:
    an encoding unit arranged in a peripheral circuit region, and the encoding unit encoding test mode signals input from an external source and transferring the encoded test mode signals to a global line;
    a decoder arranged in a core region, and the decoder receiving some of the encoded test mode signals transferred from the global lines through a local line and decoding the encoded test mode signals;
    a second test mode enable generator arranged in the core region, and the second test mode enable generator generating test mode enable signals in response to output signals of the decoder and in response to internal addresses; and
    a core circuit arranged in the core region, and controlling a test in response to the second test mode enable signals.

18. The semiconductor device as set forth in claim 17, wherein the core circuit comprises at least one of a sensing amplifier and at least one address decoder.

19. The semiconductor device as set forth in claim 17, wherein the encoding unit groups test mode signals into signal groups in which each signal group defined as corresponding to a characteristics peripheral circuit or similar circuit, and the encoding unit performs the encoding in the signal group unit.

20. The semiconductor memory device as set forth in claim 17, further comprising an address buffer buffering external addresses and providing the buffered external addresses to the internal addresses.

* * * * *